United States Patent
Ishino et al.

(10) Patent No.: US 9,812,484 B2
(45) Date of Patent: Nov. 7, 2017

(54) IMAGE PICKUP APPARATUS, IMAGE PICKUP SYSTEM, AND METHOD FOR MANUFACTURING IMAGE PICKUP APPARATUS

(71) Applicant: CANON KABUSHIKI KAISHA, Tokyo (JP)

(72) Inventors: Hideaki Ishino, Fujisawa (JP); Katsunori Hirota, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/156,791

(22) Filed: May 17, 2016

(65) Prior Publication Data

US 2016/0343750 A1    Nov. 24, 2016

(30) Foreign Application Priority Data

May 18, 2015    (JP) ................................. 2015-101335

(51) Int. Cl.
*H04N 5/225*    (2006.01)
*H01L 27/146*    (2006.01)

(52) U.S. Cl.
CPC .... *H01L 27/1463* (2013.01); *H01L 27/14614* (2013.01); *H01L 27/14623* (2013.01); *H01L 27/14636* (2013.01); *H01L 27/14698* (2013.01); *H01L 27/14643* (2013.01); *H01L 27/14689* (2013.01)

(58) Field of Classification Search
USPC ....................................................... 348/374
See application file for complete search history.

(56) References Cited

U.S. PATENT DOCUMENTS

| | | | |
|---|---|---|---|
| 2006/0115230 A1* | 6/2006 | Komoguchi | H01L 27/14601 385/146 |
| 2009/0078974 A1* | 3/2009 | Nagai | H01L 27/14625 257/292 |
| 2012/0112253 A1* | 5/2012 | Koike | H01L 27/14623 257/291 |
| 2014/0175436 A1* | 6/2014 | Yamazaki | H01L 27/1225 257/43 |
| 2015/0221694 A1* | 8/2015 | Baba | H01L 27/14634 257/443 |
| 2015/0249107 A1* | 9/2015 | Baba | H01L 27/14643 257/292 |

(Continued)

FOREIGN PATENT DOCUMENTS

| | | |
|---|---|---|
| JP | 2004-111488 A | 4/2004 |
| JP | 2005-260177 A | 9/2005 |
| JP | 2007-141938 A | 6/2007 |

(Continued)

*Primary Examiner* — Anthony J Daniels
(74) *Attorney, Agent, or Firm* — Canon U.S.A. Inc., IP Division

(57) ABSTRACT

An image pickup apparatus includes a semiconductor layer that constitutes a pixel circuit region and a peripheral circuit region. An element isolation portion is disposed in the pixel circuit region and the peripheral circuit region, defines an element portion of the semiconductor layer, and contains an insulator. The element isolation portion in the pixel circuit region has a hydrogen concentration 10 times or more higher than the hydrogen concentration of the element isolation portion in the peripheral circuit region.

20 Claims, 8 Drawing Sheets

(56) References Cited

U.S. PATENT DOCUMENTS

2016/0064450 A1* 3/2016 Horikoshi ......... H01L 27/14636
438/58

FOREIGN PATENT DOCUMENTS

| | | | | |
|---|---|---|---|---|
| JP | 2008-506261 A | 2/2008 | | |
| JP | 2008-109153 A | 5/2008 | | |
| JP | 2009-59824 A | 3/2009 | | |
| JP | 2009-188068 A | 8/2009 | | |
| JP | 2009-290089 A | 12/2009 | | |
| JP | 2010-16128 A | 1/2010 | | |
| JP | 2010-16242 A | 1/2010 | | |
| JP | 2012-23319 A | 2/2012 | | |
| KR | 2010057237 | * | 5/2010 | ........... H01L 27/146 |
| WO | WO2007/083654 A1 | 7/2007 | | |

* cited by examiner

IMAGE PICKUP APPARATUS, IMAGE PICKUP SYSTEM, AND METHOD FOR MANUFACTURING IMAGE PICKUP APPARATUS

BACKGROUND OF THE INVENTION

Field of the Invention

The present technique relates to an image pickup apparatus including a pixel circuit region and a peripheral circuit region.

Description of the Related Art

Image pickup apparatuses include a monolithic semiconductor device that includes a pixel circuit region and a peripheral circuit region on a single semiconductor layer. Different conditions are required to improve the characteristics of the pixel circuit region and the peripheral circuit region. More specifically, the pixel circuit region requires noise reduction in the pixel circuit, and the peripheral circuit region requires improved reliability of the peripheral circuit. It is known that hydrogen termination of a dangling bond on a surface of a semiconductor layer is effective in reducing noise in the pixel circuit region. However, the presence of hydrogen in the peripheral circuit region may be responsible for low reliability of the peripheral circuit. Thus, the characteristics of the pixel circuit region and the peripheral circuit region should be simultaneously improved.

Japanese Patent Laid-Open No. 2009-188068 discloses a solid-state image pickup element that includes a pixel unit, a peripheral circuit unit, and a passivation film on the pixel unit and the peripheral circuit unit, wherein the passivation film serving as a hydrogen supply source is configured to have different residual hydrogen contents on the pixel unit and the peripheral circuit unit. It is stated that such a structure can ensure the reliability of a miniaturized transistor in the peripheral circuit unit with respect to temporal changes in threshold and satisfactorily decrease dark voltage on a surface of the pixel unit. The pixel unit and peripheral circuit unit in Japanese Patent Laid-Open No. 2009-188068 correspond to the pixel circuit region and peripheral circuit region in the image pickup apparatus.

In the technique described in Japanese Patent Laid-Open No. 2009-188068, hydrogen supply to a semiconductor layer in an image pickup apparatus is not fully studied. In the image pickup apparatus, a conductive line or an insulating film on a hydrogen supply path extending from the passivation film to the semiconductor layer can restrict hydrogen supply from the passivation film to the semiconductor layer. Thus, different residual hydrogen contents of the passivation film in the pixel circuit region and the peripheral circuit region are not sufficient to cause a great difference in the amount of hydrogen supplied to the semiconductor layer between the pixel circuit region and the peripheral circuit region. Consequently, the characteristics of the pixel circuit region and the peripheral circuit region cannot be simultaneously improved.

SUMMARY OF THE INVENTION

The present disclosure provides an advantageous technique for improving the characteristics of both the pixel circuit region and the peripheral circuit region.

The present disclosure provides an image pickup apparatus including a semiconductor layer that constitutes a pixel circuit region and a peripheral circuit region. An element isolation portion is disposed in the pixel circuit region and the peripheral circuit region, defines an element portion of the semiconductor layer, and contains an insulator. The element isolation portion in the pixel circuit region has a hydrogen concentration 10 times or more higher than the hydrogen concentration of the element isolation portion in the peripheral circuit region.

The present disclosure also provides an image pickup apparatus including a semiconductor layer that constitutes a pixel circuit region and a peripheral circuit region. An element isolation portion is disposed in the pixel circuit region and the peripheral circuit region, defines an element portion of the semiconductor layer, and contains an insulator. A gate-insulating film of a MIS transistor in the peripheral circuit region has a thickness of 35 angstroms or less on a silicon oxide basis. The element isolation portion in the pixel circuit region has a higher hydrogen concentration than the element isolation portion in the peripheral circuit region.

The present disclosure also provides an image pickup apparatus including a semiconductor layer that constitutes a pixel circuit region and a peripheral circuit region. An element isolation portion is disposed in the pixel circuit region and the peripheral circuit region, defines an element portion of the semiconductor layer, and contains an insulator. A passivation film containing hydrogen, a first conductive line between the passivation film and the semiconductor layer, and a second conductive line between the first conductive line and the passivation film are disposed on the semiconductor layer in the pixel circuit region. The first conductive line and the second conductive line include an aluminum layer and a barrier metal portion containing at least one of titanium nitride and titanium. The element isolation portion in the pixel circuit region has a higher hydrogen concentration than the element isolation portion in the peripheral circuit region.

The present disclosure also provides a method for manufacturing an image pickup apparatus including a semiconductor layer that constitutes a pixel circuit region and a peripheral circuit region. The method includes preparing a semiconductor layer in the pixel circuit region and the peripheral circuit region, the semiconductor layer including an element portion defined by an element isolation portion containing an insulator, forming a member on the semiconductor layer, the member overlapping the element isolation portion in the peripheral circuit region and not overlapping at least part of the element isolation portion in the pixel circuit region, and implanting accelerated hydrogen ions into the element isolation portion in the pixel circuit region using the member as a mask.

Further features of the present invention will become apparent from the following description of exemplary embodiments with reference to the attached drawings.

DESCRIPTION OF THE EMBODIMENTS

Figure 1A:
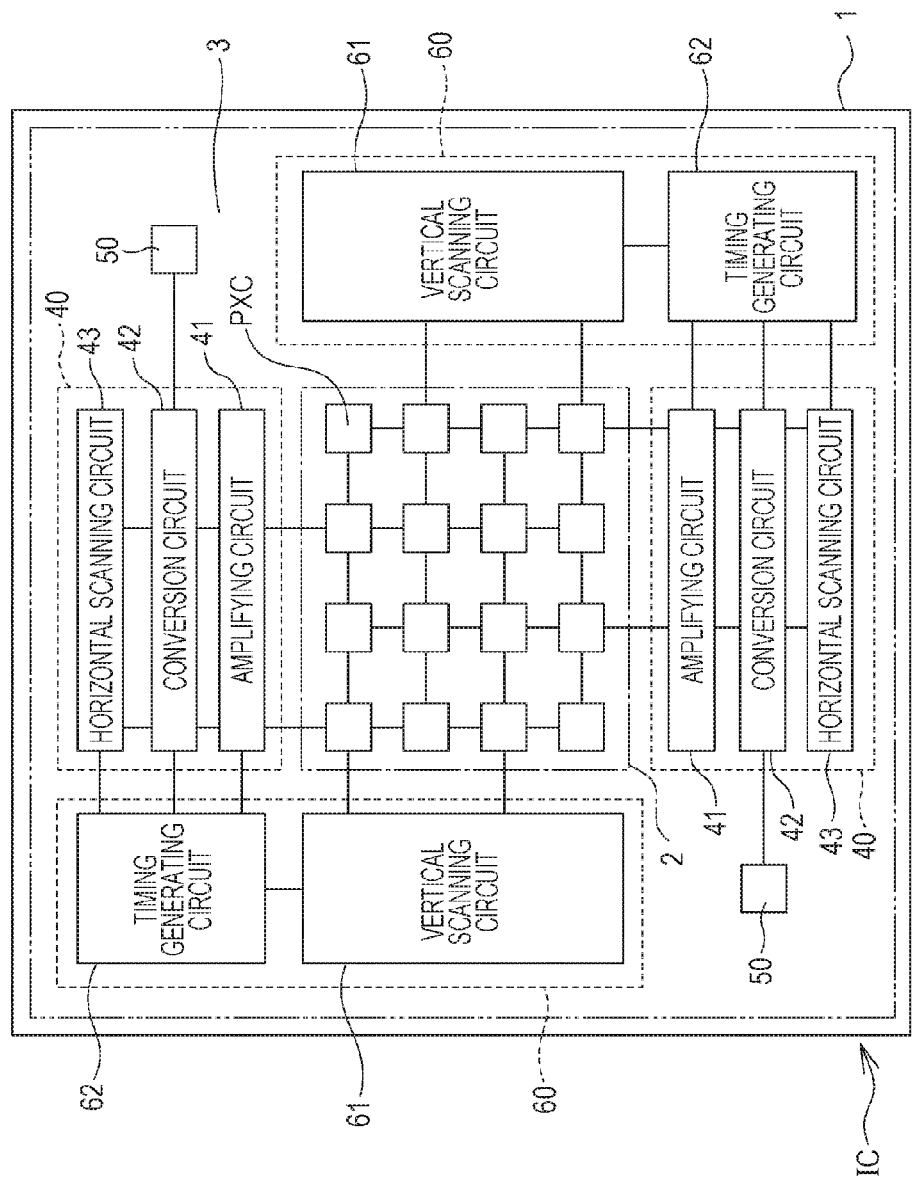
FIG. 1A is a schematic view of an image pickup apparatus according to an embodiment of the present technique.

The present inventor came up with the idea that an insulator of an element isolation portion near a surface of a semiconductor layer can be used as a hydrogen supply source. The present inventor found that the characteristics of a pixel circuit region and a peripheral circuit region can be simultaneously improved by making the concentration of hydrogen in the insulator of the element isolation portion higher in the peripheral circuit region than in the pixel circuit region.

Embodiments of the present technique will be described below with reference to the accompanying drawings. Like components are denoted by like reference numerals throughout the drawings and will not be described again.

FIG. 1A illustrates an image pickup device IC, which constitutes the whole or part of an image pickup apparatus. The image pickup device IC is a semiconductor device including an integrated circuit, and the image pickup apparatus is a semiconductor apparatus. The semiconductor device may be a semiconductor chip manufactured by dicing a semiconductor wafer.

The image pickup device IC includes a pixel circuit region 2 and a peripheral circuit region 3 on a substrate 1. The pixel circuit region 2 includes pixel circuits PXC arranged in a matrix. The peripheral circuit region 3 includes a peripheral circuit. In FIG. 1A, the pixel circuit region 2 is a region within the dash-dot line. The pixel circuit region 2 includes at least a pixel circuit that forms an effective pixel and optionally includes a pixel circuit for reference signals and/or a pixel circuit for focus detection signals. The pixel circuit that forms an effective pixel may also serve as a pixel circuit for focus detection signals.

In FIG. 1A, the peripheral circuit region 3 is a region between the dash-dot line and the dash-dot-dot line and surrounds the pixel circuit region 2. A peripheral circuit in the peripheral circuit region 3 includes a signal processing unit 40, an output unit 50, and a drive unit 60, for example. The signal processing unit 40 processes signals from a column of the pixel circuits PXC. The signal processing unit 40 includes an amplifying circuit 41 including a plurality of column amplifiers, a conversion circuit 42 including a plurality of column AD converters, and a horizontal scanning circuit 43 for selecting an output from the conversion circuit 42 and outputting the output to the output unit 50. The drive unit 60 includes a vertical scanning circuit 61 for driving a row of the pixel circuits PXC and a timing generating circuit 62 for controlling the operation timing of the horizontal scanning circuit 43 and the vertical scanning circuit 61.

Figure 1B:
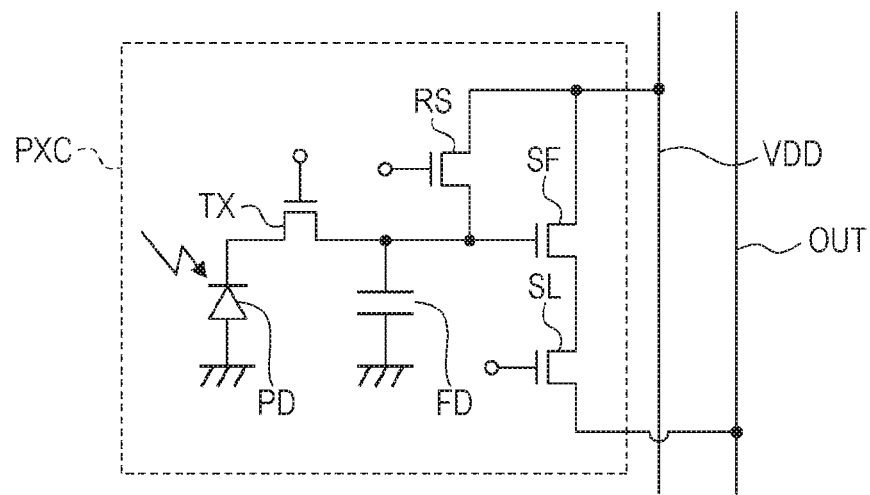
FIG. 1B is a circuit diagram of the image pickup apparatus.

FIG. 1B illustrates an example of the circuit arrangement of the pixel circuit PXC. The pixel circuit PXC includes a photoelectric conversion unit PD, a transfer gate TX, an electric carrier detecting unit FD, an amplifying transistor SF, a reset transistor RS, and a selection transistor SL. A transistor that includes the photoelectric conversion unit PD as a source, the transfer gate TX as a gate, and the electric carrier detecting unit FD as a drain is referred to as a transfer transistor. The amplifying transistor SF, the selection transistor SL, and the reset transistor RS are collectively referred to as a pixel transistor PX. All of the transfer transistor and the pixel transistor PX in the present embodiment are N-type metal insulator semiconductor (MIS) transistors. However, the pixel circuit PXC may be composed of an N-type MIS transistor and a P-type MIS transistor or may be composed of a P-type MIS transistor alone. At least one transistor in the pixel circuit PXC may be a transistor other than MIS transistors, for example, a junction field effect transistor (JFET) or a bipolar transistor. The term "MIS transistors", as used herein, are synonymous with insulated-gate field-effect transistors, and the material of gate-insulating films is not limited to pure silicon oxide. The material of gate-insulating films may be silicon nitride, silicon oxide containing nitrogen, or a low-k material, such as hafnium oxide.

The transfer gate TX transfers signal carriers from the photoelectric conversion unit PD to the electric carrier detecting unit FD. The electric carrier detecting unit FD is coupled to a gate of the amplifying transistor SF. The amplifying transistor SF is coupled to a power supply line VDD. The amplifying transistor SF is coupled to an output line OUT via the selection transistor SL. The amplifying transistor SF constitutes a source follower circuit and outputs signals to the output line OUT according to the electric potential of the electric carrier detecting unit FD. The selection transistor SL enables or disables output from the pixel circuit PXC. The reset transistor RS resets the electric potential of the electric carrier detecting unit FD to the reset voltage. In the present embodiment, the electric potential from the power supply line VDD is used as a reset voltage. The pixel circuit PXC may further include a switching unit for changing the capacity of the electric carrier detecting unit FD, in addition to the transfer gate TX, the amplifying transistor SF, and the reset transistor RS. Part of the functions of a signal-processing circuit coupled to a column of the pixel circuits PXC may be incorporated into the pixel circuits PXC.

Figure 1C:
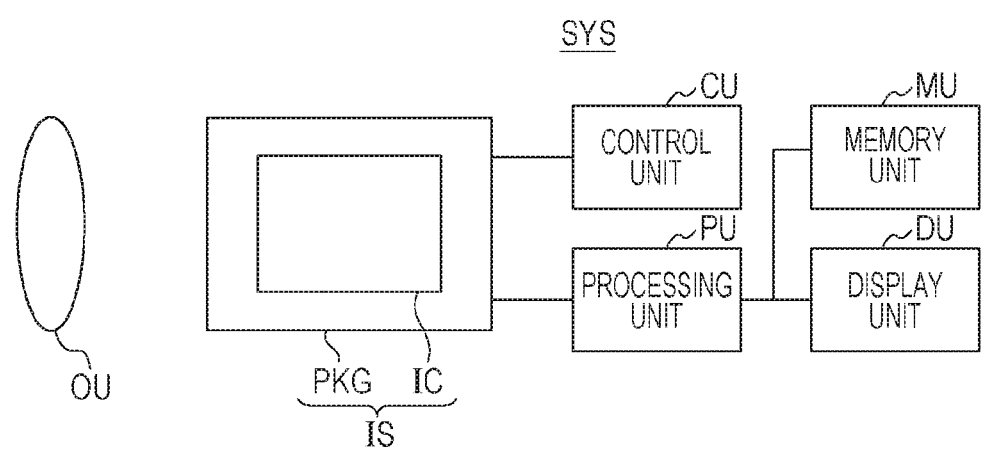
FIG. 1C is a block diagram of the image pickup apparatus.

FIG. 1C illustrates an image pickup system SYS including an image pickup apparatus IS. The image pickup system SYS is an information terminal having a camera or a photographing function. The image pickup apparatus IS may further include a package PKG for housing the image pickup device IC. The package PKG may include a base to which the image pickup device IC is fixed, a lid facing the image pickup device IC, and a connection member for coupling a terminal of the base to a terminal of the image pickup device IC. The image pickup apparatus IS may include a plurality of the image pickup devices IC in the package PKG. The image pickup apparatus IS may include another semiconductor device IC disposed on the image pickup device IC in the package PKG.

The image pickup system SYS may include an optical system OU for focusing on the image pickup apparatus IS. The image pickup system SYS may include at least one of a control unit CU, a processing unit PU, a display unit DU, and a memory unit MU. The control unit CU controls the image pickup apparatus IS. The processing unit PU processes signals sent from the image pickup apparatus IS. The display unit DU displays images sent from the image pickup apparatus IS. The memory unit MU stores images sent from the image pickup apparatus IS.

Figure 2:
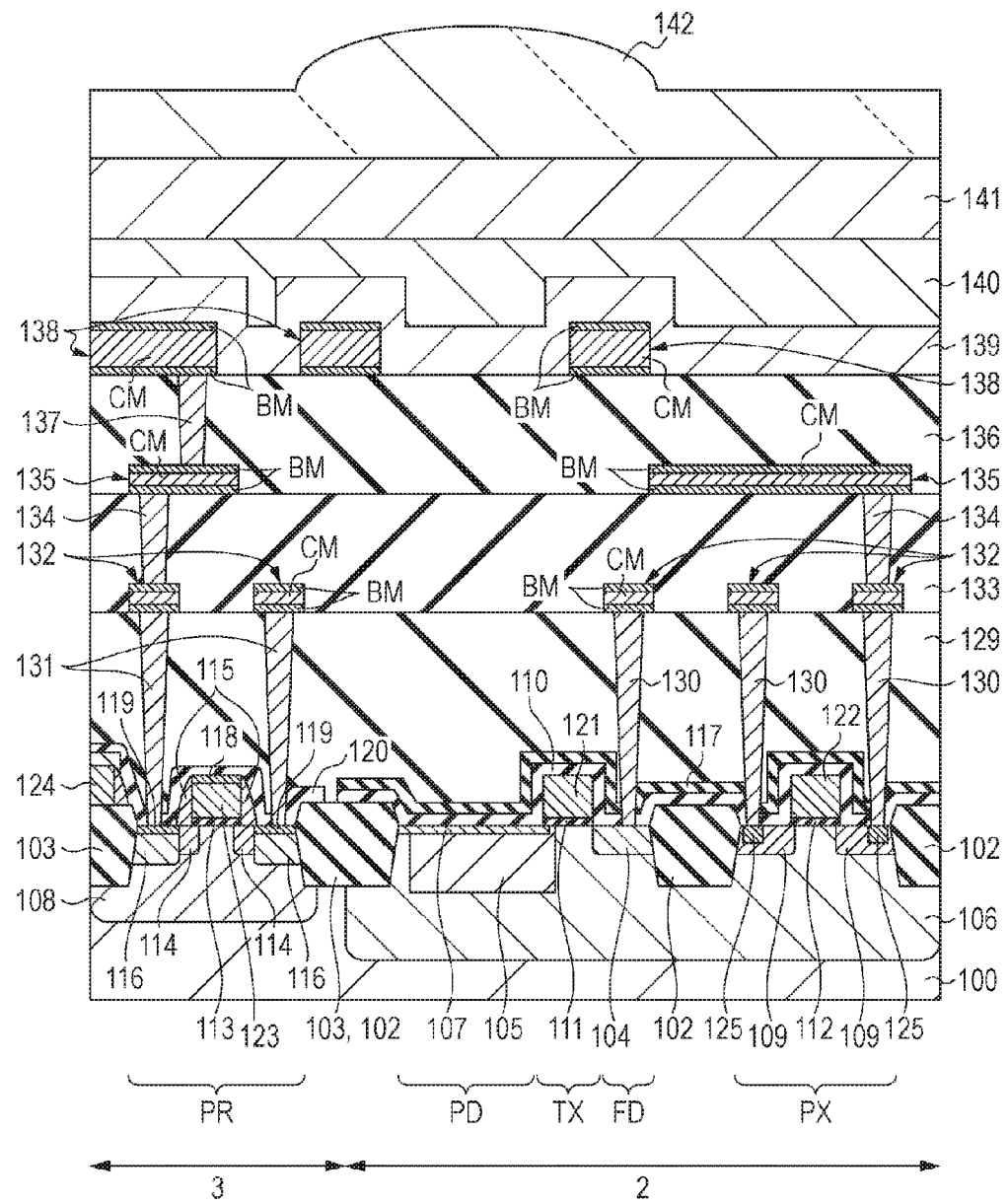
FIG. 2 is a schematic view of an image pickup apparatus.

With respect to an image pickup apparatus IS according to a first embodiment, FIG. 2 illustrates a partial section structure of one pixel circuit PXC in the pixel circuit region 2 and a partial section structure of a peripheral circuit in the peripheral circuit region 3 illustrated in FIG. 1A.

The image pickup apparatus IS includes a semiconductor layer 100, which constitutes the pixel circuit region 2 and the peripheral circuit region 3. Typically, the semiconductor layer 100 is a single-crystal silicon layer. The semiconductor layer 100 may be an epitaxial layer on the substrate 1, may be an impurity layer in bulk silicon, or may be a semiconductor layer on the substrate 1 with an interlayer insulating film interposed therebetween.

In the pixel circuit region 2, an element portion of the semiconductor layer 100 is defined by an element isolation portion 102 formed of an insulator. The element portion may also be referred to as an active region, and the element isolation portion may also be referred to as a field region. In the peripheral circuit region 3, an element portion of the semiconductor layer 100 is defined by an element isolation portion 103 formed of an insulator. The element isolation portions 102 and 103 formed of an insulator may have a local oxidation of silicon (LOCOS) structure or a shallow trench isolation (STI) structure. The element isolation portions 102 and 103 may have an element isolation structure in which an insulator film on a surface of the semiconductor layer functions as an element isolation insulator, and part or all of the insulator film protrudes from the surface of the semiconductor layer. The element isolation portion 102 in the pixel circuit region 2 may have a different structure from the element isolation portion 103 in the peripheral circuit region 3. For example, the element isolation portion 102 in the pixel circuit region 2 may have a LOCOS structure, and the element isolation portion 103 in the peripheral circuit region 3 may have a STI structure. The depth of the element isolation portion 102 in the pixel circuit region 2 from the surface of the semiconductor layer 100 may be larger than the depth of the element isolation portion 103 in the peripheral circuit region 3 from the surface of the semiconductor layer 100. In the present embodiment, the insulators of the element isolation portions 102 and 103 contain a main component and hydrogen. Typically, the main component of the insulator of each of the element isolation portions 102 and 103 is silicon oxide. The hydrogen concentration CA of the insulator of the element isolation portion 102 in the pixel circuit region 2 is higher than the hydrogen concentration CB of the insulator of the element isolation portion 103 in the peripheral circuit region 3 (CB<CA). The hydrogen concentration CA of the insulator of the element isolation portion 102 in the pixel circuit region 2 is preferably 10 times or more the hydrogen concentration CB of the insulator of the element isolation portion 103 in the peripheral circuit region 3 (10×CB≤CA).

In a process of manufacturing an image pickup apparatus, the image pickup device IC have various defects. Such defects include point defects in the semiconductor layer 100 and interface states at the interface between the semiconductor layer 100 and the element isolation portion 102. Such defects also include interface states at the interfaces between the semiconductor layer 100 and the gate-insulating films 111 and 112 and defects in the gate-insulating films 111 and 112. These defects cause performance degradation of transistors and increased noise in a pixel circuit region. Noise in the pixel circuit region 2 directly affects image quality. Thus, it is desirable that the amount of hydrogen supplied in the pixel circuit region 2 be increased to promote hydrogen termination of defects. In contrast, it is desirable that the amount of hydrogen supplied in the peripheral circuit region 3 be reduced to ensure the reliability of a MIS transistor for the following reason. In the image pickup apparatus IS, a MIS transistor in the peripheral circuit region 3 is being miniaturized due to requirements for high-speed signal processing and lower power consumption. Such miniaturization can cause low reliability of the MIS transistor, such as low hot carrier resistance or negative bias temperature instability (NBTI). Excess hydrogen accelerates such characteristic degradation. The characteristics of the pixel circuit region 2 and the peripheral circuit region 3 can be simultaneously improved by satisfying CB<CA and 10×CB≤CA.

The concentration of hydrogen in the insulators of the element isolation portions 102 and 103 can be determined by secondary ion mass spectrometry (SIMS). The SIMS analysis of the element isolation portions 102 and 103 can be performed on a surface (back surface) of the semiconductor layer 100 opposite a surface (front surface) on which the element isolation portions 102 and 103 and the transistors are disposed. The SIMS analysis may be performed on the front surface of the semiconductor layer 100 after the layers other than the semiconductor layer 100 and other than the element isolation portions 102 and 103 are removed. A method for determining the hydrogen concentrations CA and CB will be described below.

Figure 3A:
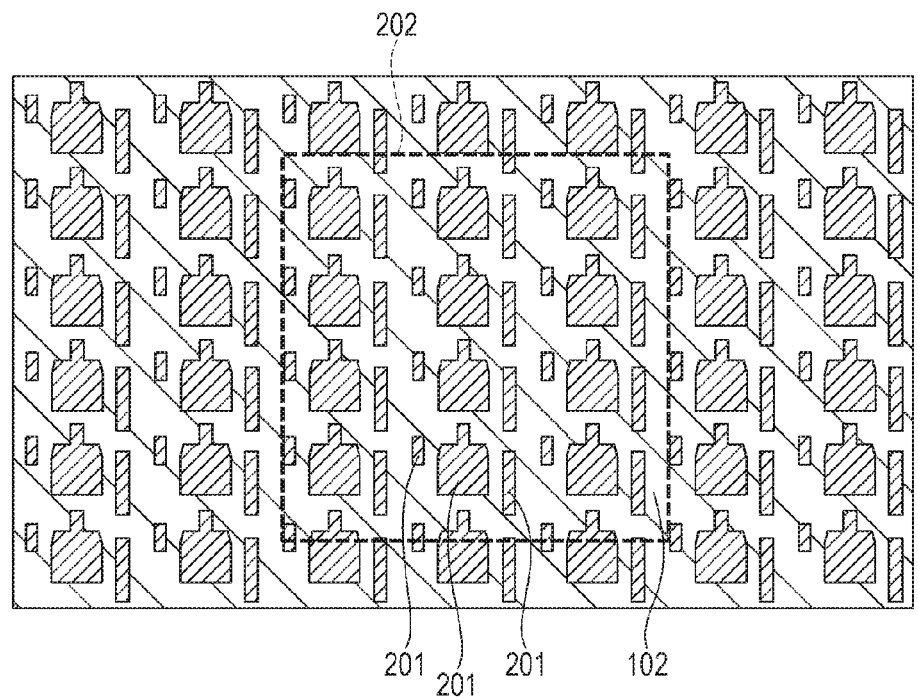
FIGS. 3A and 3B are schematic views of an image pickup apparatus.

FIG. 3A illustrates an arrangement of element portions 201 and an element isolation portion 102 in the pixel circuit region 2 and also illustrates a SIMS analysis region 202. The analysis region 202 is a rectangle having a side length of tens of micrometers or a circle having a diameter of tens of micrometers. The analysis region 202 has an area SC (cm$^2$). The pixel circuit region 2 includes an array of pixel circuit patterns each having a size of several micrometers. Thus, the analysis region 202 includes several to tens of pixel circuit patterns. The hydrogen density DA (atoms/cm$^3$) of the analysis region 202 is determined by SIMS. Because the pixel circuit region 2 includes an array of pixel circuit patterns, any area in the analysis region 202 has almost the same hydrogen density DA as measured by SIMS. The element portions 201 are made of silicon having a low hydrogen solubility limit, whereas the element isolation portion 102 is made of an insulator, such as silicon oxide, having a high hydrogen solubility limit. Thus, the element portions 201 have a negligible hydrogen concentration compared with the element isolation portion 102. Since the analysis region 202 having the hydrogen density DA includes the element portions 201 and the element isolation portion 102, the hydrogen density DA determined by SIMS is the average hydrogen density of the SIMS analysis region including the element portions 201 and the element isolation portion 102. Since the element portions 201 have a negligible hydrogen concentration compared with the element isolation portion 102, the hydrogen density DA determined by SIMS is not comparable to the hydrogen concentration CA of the element isolation portion 102. This is because the element isolation portion 102 does not spread over the entire analysis region, but the element portions 201 and the element isolation portion 102 coexist in the analysis region. Thus, the actual hydrogen concentration CA of the element isolation portion 102 is determined as described below. First, the area occupancy OA of the element isolation portion 102 in the analysis region 202 is determined. The area occupancy can be calculated from the computer-aided design (CAD) data used for the layout design of the element isolation portion 102. The area occupancy OA of the element isolation portion 102 is calculated by dividing the total area SA (cm$^2$) of the element isolation portion 102 in a plan view of the analysis region 202 by the area SC of the analysis region 202 (OA=SA/SC). The hydrogen concentration CA of the insulator of the element isolation portion 102 is calculated by dividing the hydrogen density DA of the analysis region 202 by the area occupancy OA of the element isolation portion 102 (CA=DA/OA). The area occupancy OA is more than 0 and less than 1 and typically ranges from approximately 0.2 to 0.6. In the image pickup apparatus IS, in order to increase the light receiving area of the photoelectric conversion unit PD, the element portions 201 in the pixel circuit region 2 are larger than the element isolation portion 102, and the area occupancy OA of the element isolation portion 102 may be 0.5 or less.

Figure 3B:
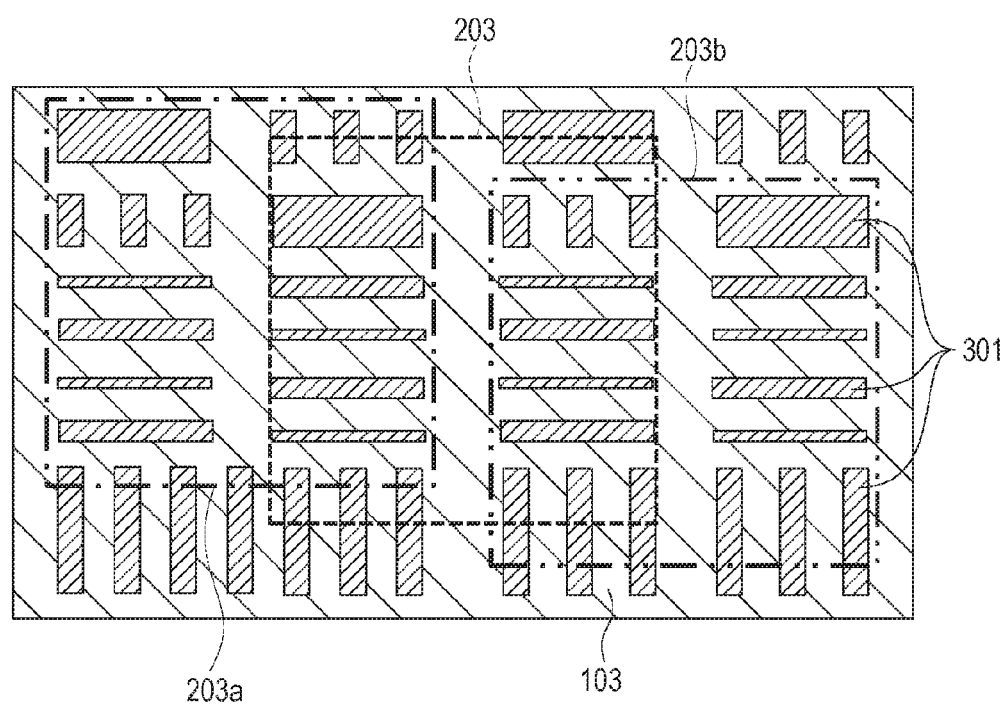

FIG. 3B illustrates an arrangement of element portions 301 and an element isolation portion 103 in the peripheral circuit region 3 and also illustrates a SIMS analysis region 203. The peripheral circuit region 3 is analyzed by SIMS in the same manner as described above. Unlike the pixel circuit region 2, the peripheral circuit region 3 has a random circuit pattern. Thus, the area occupancy of the element isolation portion 103 in the analysis region 203 varies in different SIMS analysis areas. Thus, the area occupancy of each element isolation portion 103 in regions 203a and 203b in the peripheral circuit region 3 is determined. The outlines of the regions 203a and 203b are geometrically identical with the outline of the analysis region 202 in the pixel circuit region 2. The average area occupancy OB of the element isolation portions 103 are calculated from the area occupancies thus determined. The area occupancies can be calculated from the CAD data used for the layout design of the element isolation portion 103. The area occupancy OB is more than 0 and less than 1 and typically ranges from approximately 0.4 to 0.8. A region that has the average area occupancy OB and is geometrically identical with the analysis region 202 in the pixel circuit region 2 is selected as the analysis region 203 in the peripheral circuit region 3. The hydrogen density DB (atoms/cm$^3$) of the analysis region 203 is determined by SIMS. The hydrogen concentration CB of the insulator of the element isolation portion 103 is calculated by dividing the hydrogen density DB of the analysis region 203 by the area occupancy OB of the element isolation portion 103 (CB=DB/OB).

In the image pickup apparatus IS, in order to increase the light receiving area of the photoelectric conversion unit PD, the element portions 201 in the pixel circuit region 2 are larger than the element isolation portion 102. Thus, the area occupancy OA of the element isolation portion 102 in the pixel circuit region 2 is lower than the area occupancy OB of the element isolation portion 103 in the peripheral circuit region 3 (OA<OB). The amount of hydrogen per unit volume supplied from the element isolation portion can be higher in the pixel circuit region 2 than in the peripheral circuit region 3. The amount QA of hydrogen per unit volume available from the element isolation portion 102 in the pixel circuit region 2 is proportional to the product of the hydrogen concentration CA and the area occupancy OA (QA∝CA×OA). Likewise, the amount QB of hydrogen per unit volume available from the element isolation portion 103 in the peripheral circuit region 3 is proportional to the product of the hydrogen concentration CB and the area occupancy OB (QB∝CB×OB). Thus, satisfying QB<QA means satisfying CB×OB<CA×OA. In order to satisfy both OA<OB and CB×OB<CA×OA, 10×CB≤CA can be satisfied. On the basis of CA×OA=DA and CB×OB=DB, whether QB<QA is satisfied can be judged by comparing the amounts of hydrogen measured by SIMS in the analysis regions 202 and 203 having the same shape.

The photoelectric conversion unit PD in FIG. 1B is a photodiode and is composed of an n-type impurity region 105 and a p-type impurity region 106 in FIG. 2. The impurity region 105 functions as an accumulation region in which signal carriers accumulate. The photodiode has an embedded structure in which a p-type impurity region 107 is disposed between the impurity region 105 and a surface of the semiconductor layer 100.

A conductivity type in which electric carriers treated as signal carriers in the pixel circuit are majority carriers is hereinafter referred to as a first conductivity type, and a conductivity type in which electric carriers treated as signal carriers are minority carriers is hereinafter referred to as a second conductivity type. In the case that signal carriers are electrons, the n-type is the first conductivity type, and the p-type is the second conductivity type. In the case that signal carriers are positive holes, the p-type is the first conductivity type, and the n-type is the second conductivity type.

The p-type impurity region 106 functions as a well region. The impurity region 106 may be composed of a plurality of impurity regions having different p-type impurity concentrations. A first element portion including the impurity region 105 of the photoelectric conversion unit PD includes a gate electrode 121 and an impurity region 104. The gate electrode 121 constitutes the transfer gate TX. The impurity region 104 functions as a floating diffusion region of the electric carrier detecting unit FD. A second element portion separated from the first element portion by the element isolation portion 102 includes a gate electrode 122 of the pixel transistor PX, an impurity region 109 constituting a source/drain, and an impurity region 125 coupled to a contact plug 130.

A MIS transistor in the peripheral circuit is referred to as a peripheral transistor PR. In order to achieve high withstand voltage in the pixel circuit and high speed in the peripheral circuit, a gate-insulating film 113 of the peripheral transistor PR can have a smaller thickness than a gate-insulating film 111 of the transfer gate TX and a gate-insulating film 112 of the pixel transistor PX in the pixel circuit. For example, when the pixel circuit has a driving voltage of 3.3 V, the gate-insulating films 111 and 112 of the transfer gate TX and the pixel transistor PX have an equivalent oxide thickness (EOT) of approximately 80 angstroms on a silicon oxide basis. In contrast, when the peripheral circuit has a driving voltage of 1.3 V, the gate-insulating film of the peripheral transistor PR has an equivalent oxide thickness (EOT) of 35 angstroms or less on a silicon oxide basis. When the gate-insulating film 113 of the MIS transistor in the peripheral circuit has a small thickness, boron contained in a gate electrode 123 in the peripheral circuit region 3 diffuses into the semiconductor layer 100 through the gate-insulating film 113. This causes a change in the threshold voltage of the P-type MIS (PMIS) transistor. In order to avoid this problem, a silicon oxide film doped with nitrogen can be used as a gate-insulating film. In general, use of a silicon oxide film doped with nitrogen can reduce changes in the threshold of the PMIS transistor but increase negative bias temperature instability (NBTI). This reduces the reliability of the peripheral transistor PR.

In order to improve the reliability of the peripheral transistor PR, the amount of hydrogen supplied to the peripheral transistor PR can be decreased. As described above, the characteristics of the pixel circuit region 2 and the peripheral circuit region 3 can be simultaneously improved by satisfying CB<CA and 10×CB≤CA.

Conductive lines 132, 135, and 138 are electroconductive members (aluminum conductive lines) including a conductive portion CM and a barrier metal portion BM. The conductive portion CM is composed of aluminum. The barrier metal portion BM is composed of a titanium layer and/or a titanium nitride layer. The conductive portion CM composed of aluminum may contain a minute amount of copper. The aluminum conductive line may include Ti/TiN/Al/Ti/TiN layers in this order from the side of the semiconductor layer 100. Plugs 130, 131, 134, and 137 are electroconductive members each including a conductive portion and a barrier metal portion. The conductive portion is composed of a tungsten layer. The barrier metal portion is composed of a titanium layer and/or a titanium nitride layer. Like the conductive lines 132, 135, and 138, an electroconductive member including a conductive portion composed of an aluminum layer and a barrier metal portion composed of a titanium layer and/or a titanium nitride layer may also be used as a light-shielding member. The conductive lines and plugs may also be electroconductive members (copper conductive lines) including a conductive portion composed of a copper layer and a barrier metal portion composed of a tantalum layer and/or a tantalum nitride layer.

In the barrier metal portion of the electroconductive members (conductive lines) above the semiconductor layer 100, titanium occludes hydrogen, and titanium nitride restricts hydrogen diffusion. The conductive line 132 is disposed between a passivation film 139 and the semiconductor layer 100. The conductive lines 135 and 138 are disposed between the conductive line 132 and the passivation film 139. Such a barrier metal portion composed of a titanium layer and a titanium nitride layer above the semiconductor layer 100 prevents hydrogen supplied from above from reaching the semiconductor layer 100.

In the present embodiment, the element isolation portion 102 near the semiconductor layer 100 contains more hydrogen than the element isolation portion 103. Thus, hydrogen can be supplied to the semiconductor layer 100 with a minor influence of the titanium layer and/or the titanium nitride layer.

An interlayer insulating film 129 is disposed between the conductive line 132 and the semiconductor layer 100 in the pixel circuit region 2 and the peripheral circuit region 3. An interlayer insulating film 133 is disposed between the conductive line 132 and the conductive line 135. The plug 134 penetrates the interlayer insulating film 133. An interlayer insulating film 136 is disposed between the conductive line 135 and the conductive line 138. The plug 137 penetrates the interlayer insulating film 136. The pixel circuit region 2 includes a silicon nitride layer 110 between the interlayer insulating film 129 and the element isolation portion 102. The peripheral circuit region 3 includes a silicon nitride layer 120 between the interlayer insulating film 129 and the element isolation portion 103. The plug 130 penetrates the silicon nitride layer 110, and the plug 131 penetrates the silicon nitride layer 120. The silicon nitride layers 110 and 120 may also restrict hydrogen diffusion. In the present embodiment, the element isolation portion 102 near the semiconductor layer 100 contains more hydrogen than the element isolation portion 103. Thus, hydrogen can be supplied to the semiconductor layer 100 with a minor influence of the silicon nitride layers 110 and 120.

The photoelectric conversion unit PD, the transfer gate TX, and the electric carrier detecting unit FD are covered with the silicon nitride layer 110. The silicon nitride layer 110 also covers the pixel transistor PX, more specifically, the amplifying transistor SF. If the silicon nitride layer 110 restricts hydrogen supply from the outside, hydrogen supply to the photoelectric conversion unit PD and the amplifying transistor SF is also restricted. This can increase dark current in the photoelectric conversion unit PD, the transfer gate TX, and the electric carrier detecting unit FD, and increase random noise in the amplifying transistor SF. In the present embodiment, the element isolation portion 102 near the semiconductor layer 100 contains more hydrogen than the element isolation portion 103. Thus, hydrogen can be supplied to the semiconductor layer 100 even in the presence of the silicon nitride layer 110.

The interlayer insulating film 129 may be a borosilicate glass (BSG) layer, a phosphosilicate glass (PSG) layer, or a boron-phosphosilicate glass (BPSG) layer. The BSG layer, PSG layer, and BPSG layer may restrict hydrogen diffusion. When copper conductive lines are used, a silicon carbide layer or a silicon nitride layer is used as a diffusion-barrier layer. The silicon carbide layer or silicon nitride layer may also restrict hydrogen diffusion. Because the element isolation portion 102 near the semiconductor layer 100 contains more hydrogen than the element isolation portion 103 in the present embodiment, hydrogen can be supplied to the semiconductor layer 100 with a minor influence of the BSG layer, PSG layer, BPSG layer, silicon carbide layer, or silicon nitride layer. The interlayer insulating films 133 and 136 are silicon oxide layers.

At least the uppermost conductive line 138 in the peripheral circuit region 3 is covered with the passivation film 139. The conductive line 138 functions as a grid-like light-shielding member in the pixel circuit region 2. A light-shielding member (not shown) for shading a photoelectric conversion unit in a light shielded pixel is disposed at the same height as the conductive line 138 from the semiconductor layer 100. The passivation film 139 extends over a plurality of the photoelectric conversion units PD in the pixel circuit region 2. The passivation film 139 contains hydrogen and can supply hydrogen to the semiconductor layer 100, in addition to hydrogen supply from the element isolation portions 102 and 103 to the semiconductor layer 100. The passivation film 139 can include a silicon nitride layer mainly containing hydrogen and a silicon oxynitride layer for suppressing reflection from the top and/or bottom surface of the silicon nitride layer. A planarizing film 140, a color filter 141, and a microlens 142 are disposed on the passivation film 139.

A method for manufacturing an image pickup apparatus IS according to a first embodiment will be described below with reference to FIGS. 4A to 4C and FIGS. 5A and 5B.

Figure 4A:
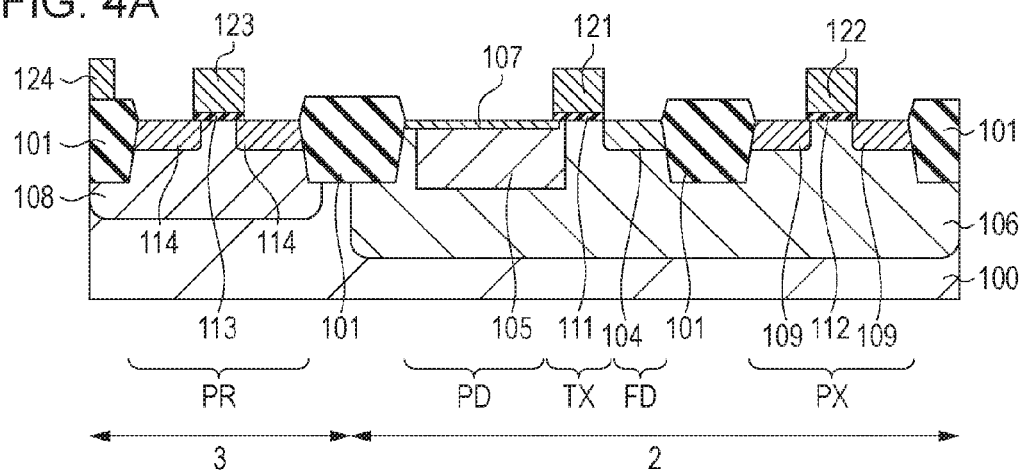
FIGS. 4A to 4C are schematic views illustrating a method for manufacturing an image pickup apparatus.

In a process a1 illustrated in FIG. 4A, first, an element isolation portion 101 is formed on or above a semiconductor layer 100 in a pixel circuit region 2 and a peripheral circuit region 3, for example, by a LOCOS method or a STI method. Impurity regions 106 and 108 are then formed as well regions. Gate-insulating films 111 and 112 of a pixel transistor PX and a gate-insulating film 113 of a peripheral transistor PR are then formed. The gate-insulating films 111, 112, and 113 can be converted into silicon oxide films containing nitrogen by thermal oxynitriding of the semiconductor layer 100 or by plasma nitriding of a silicon oxide film formed by thermal oxidation of the semiconductor layer 100. Then, a gate electrode 121 is formed on the gate-insulating film 111, a gate electrode 122 made of polysilicon is formed on the gate-insulating film 112, and a gate electrode 123 is formed on the gate-insulating film 113. The gate electrodes 121 and 122 may contain an n-type impurity, such as phosphorus. The gate electrodes 121 and 123 may contain a p-type impurity, such as boron. An electrical resistance 124 made of polysilicon is formed. Impurity regions 104, 105, 109, 107, and 114 are then formed.

Figure 4B:
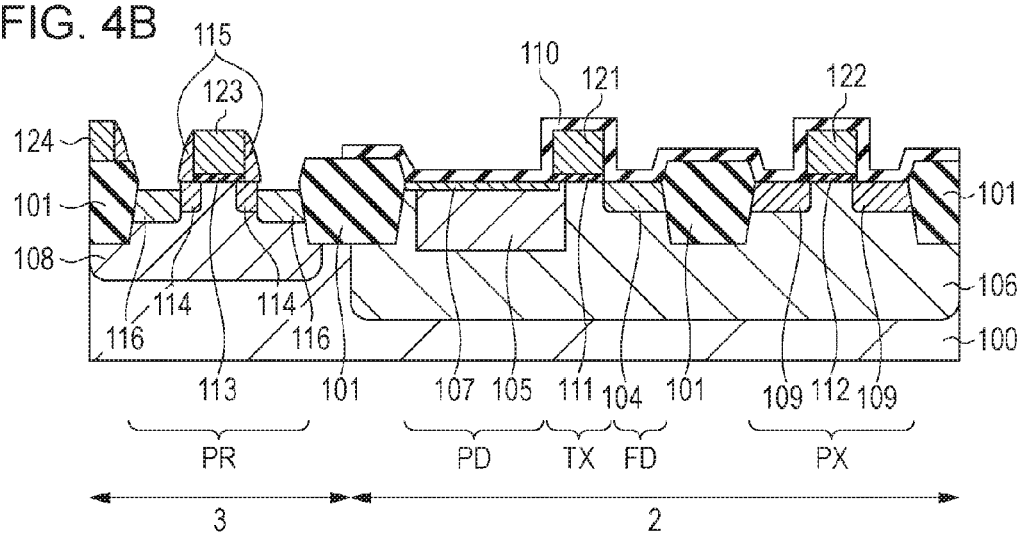

In a process b1 illustrated in FIG. 4B, first, the semiconductor layer 100 in the pixel circuit region 2 and the peripheral circuit region 3 is covered with a dielectric film. The dielectric film formed in the process b1 is a silicon nitride monolayer film or a multilayer film including a silicon nitride layer and a silicon oxide layer. While a portion of the dielectric film in the pixel circuit region 2 is covered with a mask, a portion of the dielectric film in the peripheral circuit region 3 is etched. Thus, a sidewall spacer 115 is formed on the side walls of the gate electrode 123. An impurity region 116 is formed in the source/drain of the peripheral transistor PR using the sidewall spacer 115 as a mask. The high-concentration impurity region 116 and the low-concentration impurity region 114 can constitute a lightly doped drain (LDD) structure in the source/drain of the peripheral transistor PR. An impurity region is formed in the semiconductor layer 100 by ion implantation and is activated by heat treatment at a temperature in the range of approximately 800° C. to 1100° C.

The unetched portion of the dielectric film in the pixel circuit region 2 is a silicon nitride layer 110. The silicon nitride layer 110 can function as a protective layer for protecting the pixel circuit region 2 from metal contamination or plasma damage and thereby reduce the number of white defects. The silicon nitride layer 110 more greatly restricts hydrogen diffusion than the silicon oxide layer. Thus, the silicon nitride layer 110 can restrict hydrogen supply when hydrogen is supplied to the semiconductor layer 100 from above during heat treatment in a downstream process.

Figure 4C:
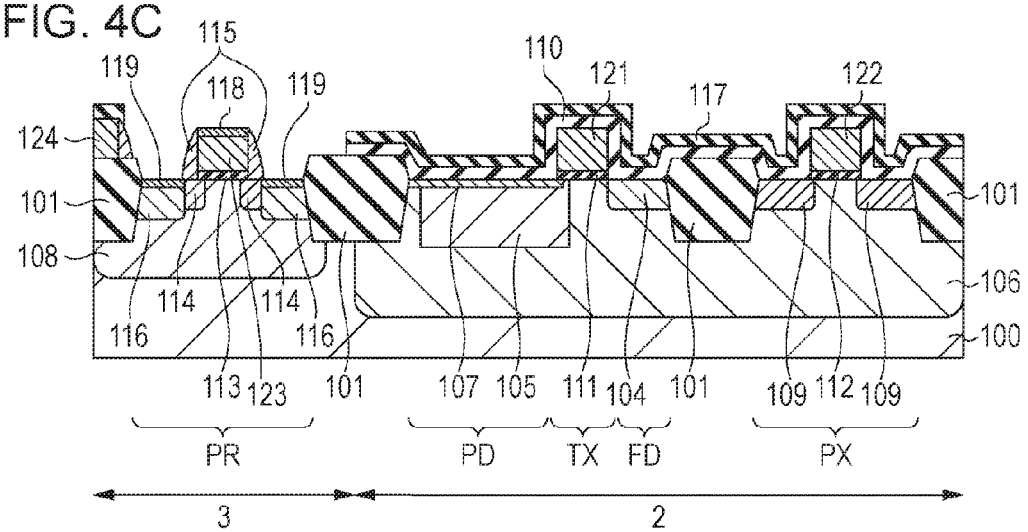

In a process c1 illustrated in FIG. 4C, first, the pixel circuit region 2 and the electrical resistance 124 are covered with an insulator layer 117. The peripheral transistor PR is not covered with the insulator layer 117. The semiconductor layer 100 in the pixel circuit region 2 and the peripheral circuit region 3 is then covered with a metal film. The material of the metal film can be cobalt, nickel, tungsten, molybdenum, tantalum, chromium, palladium, and/or platinum, typically, cobalt or nickel. A self-aligned silicide (salicide) process is then performed using the insulator layer 117 for silicide protection. More specifically, a contact portion between the semiconductor layer 100 and the metal film is selectively silicidized by heat treatment. The heat treatment is performed at a temperature in the range of 400° C. to 600° C. in a first stage for forming monosilicide and at a temperature in the range of 700° C. to 1000° C. in a second stage for forming disilicide. Thus, silicide regions 118 and 119 formed of a silicide of a metal contained in the metal film are formed in the peripheral transistor PR. Typically, the silicide regions 118 and 119 are cobalt silicide regions or nickel silicide regions. The silicide region 118 does not have to be disposed on the gate electrode 123. The insulator layer 117 covering the electrical resistance 124 can prevent a decrease in electrical resistance resulting from silicidation of the electrical resistance 124. Unreacted metals in the salicide process are removed from the insulator layer 117.

Figure 5A:
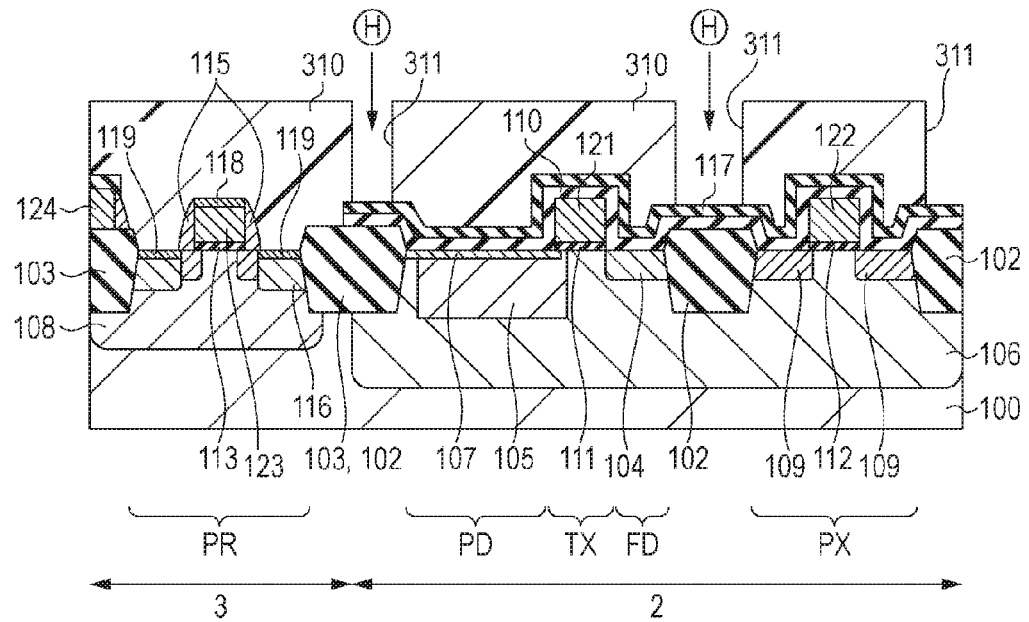
FIGS. 5A and 5B are schematic views illustrating a method for manufacturing an image pickup apparatus.

In a process d1 illustrated in FIG. 5A, a mask member 310 is formed over the semiconductor layer 100 thus formed. The mask member 310 is composed of a resin, such as a photoresist. The mask member 310 covers the element isolation portion 103 in the peripheral circuit region 3. The mask member 310 has an opening 311 on at least part of the element isolation portion 102 in the pixel circuit region 2. Thus, the mask member 310 does not overlap at least part of the element isolation portion 102 in the pixel circuit region 2. Although the mask member 310 covers the element portion in the pixel circuit region 2, the mask member 310 does not have to cover the element portion in the pixel circuit region 2. The mask member 310 may be disposed only on the element isolation portion 103 in the peripheral circuit region 3. Accelerated hydrogen ions are implanted into the element isolation portion 102 in the pixel circuit region 2 using the mask member 310 as a mask. The ion implantation is performed through the mask member 310 such that the concentration of hydrogen in the insulator of the element isolation portion 102 in the pixel circuit region 2 is higher than the concentration of hydrogen in the insulator of the element isolation portion 103 in the peripheral circuit region 3. Although part of accelerated hydrogen ions may also be implanted into the element isolation portion 103 through the mask member 310, the number of implanted hydrogen ions is much smaller in the element isolation portion 103 than in the element isolation portion 102 not covered with the mask member 310. The ion implantation method allows hydrogen to be implanted into the element isolation portion 102 even when the element isolation portion 102 in the pixel circuit region 2 is covered with the silicon nitride layer 110. Furthermore, even when the photoelectric conversion unit PD or the amplifying transistor SF is covered with the silicon nitride layer 110, hydrogen can be implanted into the element isolation portion 102, and therefore the element isolation portion 102 can supply sufficient hydrogen to the photoelectric conversion unit PD and the amplifying transistor SF. After hydrogen ions are implanted, the mask member 310 is removed.

Figure 5B:
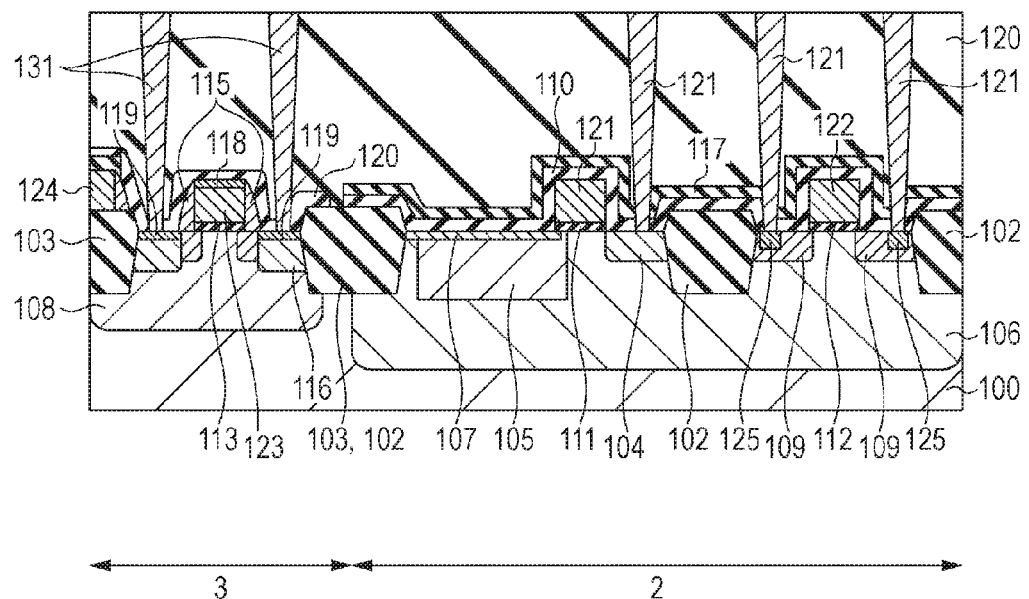

In a process e1 illustrated in FIG. 5B, the peripheral transistor PR in the peripheral circuit region 3 is covered with a silicon nitride layer 120. The silicon nitride layer 120 does not cover the pixel transistor PX in the pixel circuit region 2. The semiconductor layer 100 in the pixel circuit region 2 and the peripheral circuit region 3 is then covered with an interlayer insulating film 129. The interlayer insulating film 129 is flattened by reflowing. The heat treatment temperature for the reflowing may range from 600° C. to 1000° C. In order to further improve flatness, the interlayer insulating film 129 is subjected to chemical mechanical polishing (CMP).

A contact hole is formed in the interlayer insulating film 129 in the pixel circuit region 2. In the formation of the contact hole, the silicon nitride layer 110 can function as an etching stopper. A contact plug 130 coupled to the semiconductor layer 100 or the gate electrode 121 or 122 is then formed in the contact hole. A contact hole is formed in the interlayer insulating film 129 in the peripheral circuit region 3. In the formation of the contact hole, the silicon nitride layer 120 can function as an etching stopper. A contact plug 131 coupled to the semiconductor layer 100 or the gate electrode 123 is then formed in the contact hole. The contact hole for the contact plug 130 and the contact hole for the contact plug 131 may be simultaneously or separately formed. The contact plug 130 and the contact plug 131 may be simultaneously or separately formed. Before the contact plug 130 is formed, the impurity region 125 may be formed by implanting an impurity into the well through a desired contact hole (ion implantation). This can stabilize contact resistance. In order to activate the impurity region 125, heat treatment may be performed at a temperature in the range of 600° C. to 900° C. Before the contact plug 130 is formed, the contact hole for the contact plug 130 may be washed with an acidic or alkaline solution, such as hydrofluoric acid or an ammonia hydrogen peroxide mixture. The contact hole can be washed after an impurity is implanted into the contact hole. This can reduce contamination of the semiconductor layer 100 with metals. After the contact plug 130 is formed, a portion of the semiconductor layer 100 in contact with the contact plug 130 may be silicidized by heat treatment at 600° C. or less so as to decrease contact resistance. In this case, a silicide region of tungsten or titanium contained in the contact plug 130 may be formed in the portion of the semiconductor layer 100 in contact with the contact plug 130.

After that, the structure illustrated in FIG. 2 is formed. A conductive line 132 and an interlayer insulating film 133 are formed on the interlayer insulating film 129. A via plug 134 coupled to the conductive line 132 is formed in the interlayer insulating film 133. A conductive line 135 and an interlayer insulating film 136 are formed on the interlayer insulating film 133. A via plug 137 coupled to the conductive line 135 is formed in the interlayer insulating film 136. A conductive line 138 is formed on the interlayer insulating film 136. The interlayer insulating films 133 and 136 may be silicon oxide films formed by high-density plasma (HDP)-chemical vapor deposition (CVD). This can increase the hydrogen contents of the interlayer insulating films 133 and 136. The conductive line 138 is covered with a passivation film 139. The passivation film 139 may be a monolayer film including a silicon nitride layer or a multilayer film including a silicon nitride layer and a silicon oxynitride layer for antireflection disposed on the top and/or bottom surface of the silicon nitride layer.

A portion of the passivation film 139 disposed on a pad electrode (PAD) for input to or output from the outside is opened. Hydrogen is then supplied from the passivation film 139 to the semiconductor layer 100 by heat treatment in an atmosphere of $N_2$, $H_2$, or a mixture thereof. The heat treatment temperature ranges from 350° C. to 450° C., for example.

The insulator of the element isolation portion 102 in the pixel circuit region 2 has a higher hydrogen concentration than the insulator of the element isolation portion 103 in the peripheral circuit region 3. The element isolation portion 102 is closer than the conductive lines 132, 135, and 138 and the plugs 131, 134, and 137 to the semiconductor layer 100. The conductive lines 132, 135, and 138 include a titanium nitride layer that occludes hydrogen or restricts hydrogen diffusion. Thus, the element isolation portion 102 is an effective hydrogen supply source. This can reduce the amount of hydrogen supplied in the peripheral circuit region 3 and increase the amount of hydrogen supplied in the pixel circuit region 2.

After the heat treatment, the planarizing film 140, the color filter 141, and the microlens 142 are formed on the passivation film 139.

In general, after the process d1 of hydrogen ion implantation, it is desirable that the process temperature be lowered to prevent hydrogen in the element isolation portion 102 from diffusing into the outside. In the present embodiment, however, not only the photoelectric conversion unit PD but also the pixel transistor PX and the element isolation portion 102 are entirely covered with the silicon nitride layer 110. The silicon nitride layer 110 can prevent hydrogen in the element isolation portion 102 from diffusing into the outside. The silicon nitride layer 110 preferably has a thickness of 50 nm or more in order to prevent hydrogen from diffusing into the outside.

A method for manufacturing an image pickup apparatus IS according to a second embodiment will be described below with reference to FIGS. 6A to 6C and FIGS. 7A and 7B.

The present embodiment is different from the first embodiment in that the silicon nitride layer 110 in the first embodiment is replaced with a silicon nitride layer 210. The timing of hydrogen ion implantation is also different from the first embodiment.

Figure 6A:
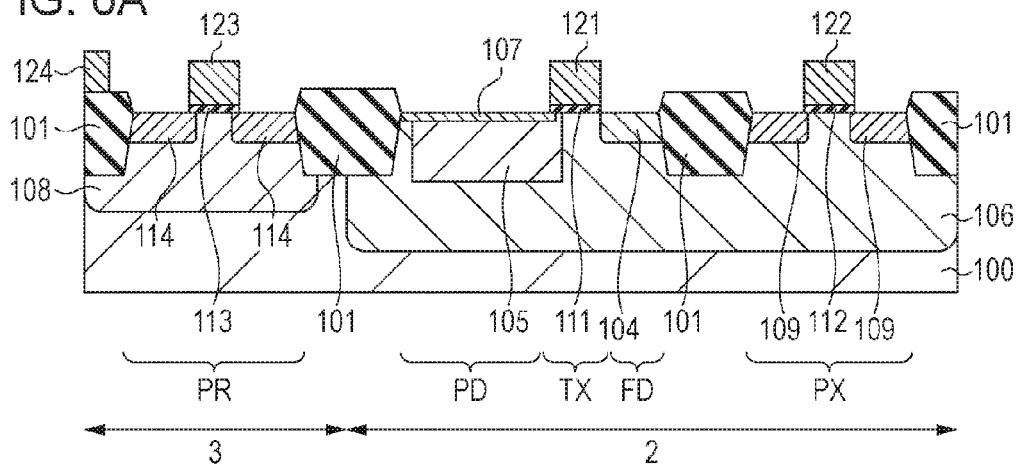
FIGS. 6A to 6C are schematic views illustrating a method for manufacturing an image pickup apparatus.

A process a2 illustrated in FIG. 6A can be performed in the same manner as the process a1 and will not be described here.

Figure 6B:
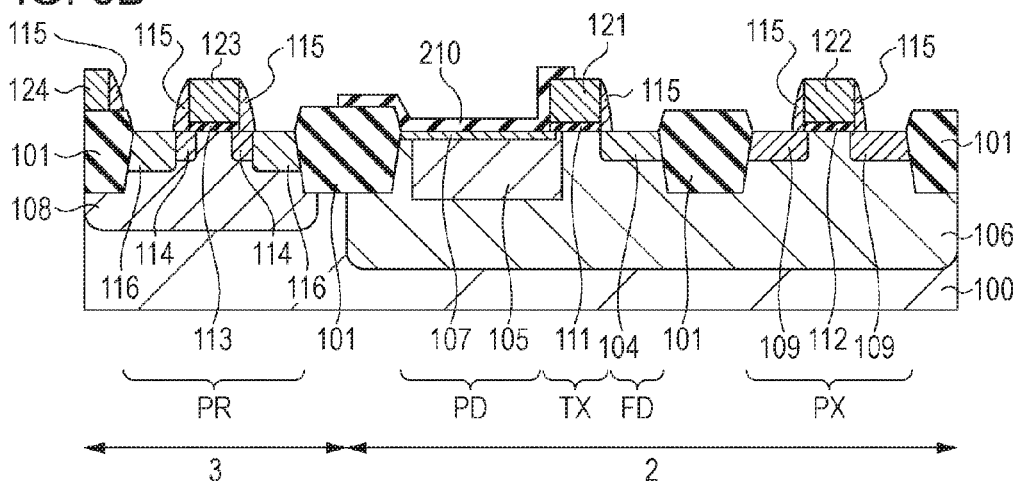

In a process b2 illustrated in FIG. 6B, first, the semiconductor layer 100 in the pixel circuit region 2 and the peripheral circuit region 3 is covered with a dielectric film. While a portion of the dielectric film disposed on the photoelectric conversion unit PD in the pixel circuit region 2 is covered with a mask, portions of the dielectric film disposed on the pixel transistor PX and the peripheral transistor PR are etched. Thus, a sidewall spacer 115 is formed on the side walls of the gate electrodes 122 and 123. An impurity region 116 is formed in the source/drain of the peripheral transistor PR using the sidewall spacer 115. The high-concentration impurity region 116 and the low-concentration impurity region 114 can constitute a lightly doped drain (LDD) structure in the source/drain of the peripheral transistor PR.

The dielectric film formed in the process b2 is a silicon nitride monolayer film or a multilayer film including a silicon nitride layer and a silicon oxide layer. The unetched portion of the dielectric film in the pixel circuit region 2 is the silicon nitride layer 210. The silicon nitride layer 210 can function as a protective layer for protecting the pixel circuit region 2 from metal contamination or plasma damage and thereby reduce the number of white defects. The silicon nitride layer 210 more greatly restricts hydrogen diffusion than the silicon oxide layer. Thus, the silicon nitride layer 210 can restrict hydrogen supply when hydrogen is supplied to the semiconductor layer 100 from above during heat treatment in a downstream process.

Figure 6C:
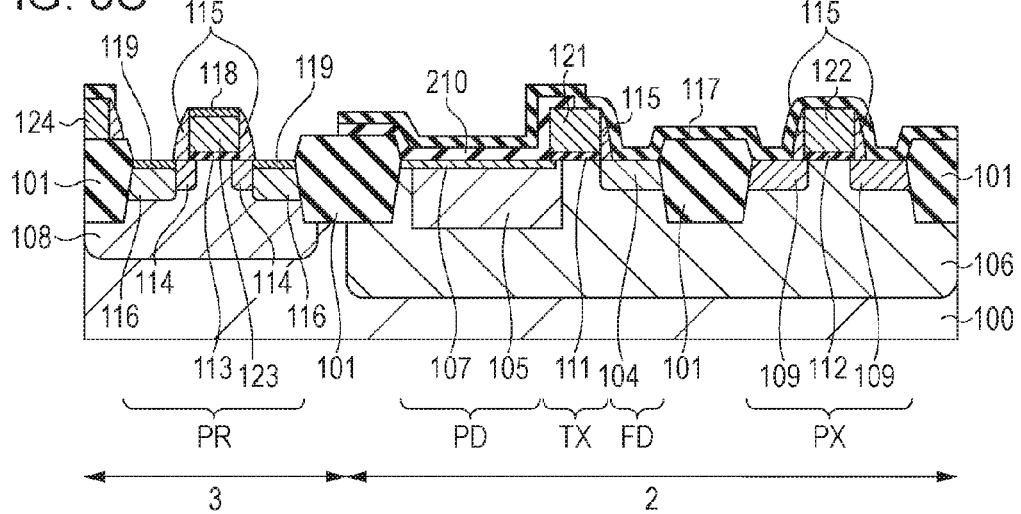

In a process c2 illustrated in FIG. 6C, silicide regions 118 and 119 are formed in the peripheral transistor PR by a salicide process in the same manner as the process c1.

Figure 7A:
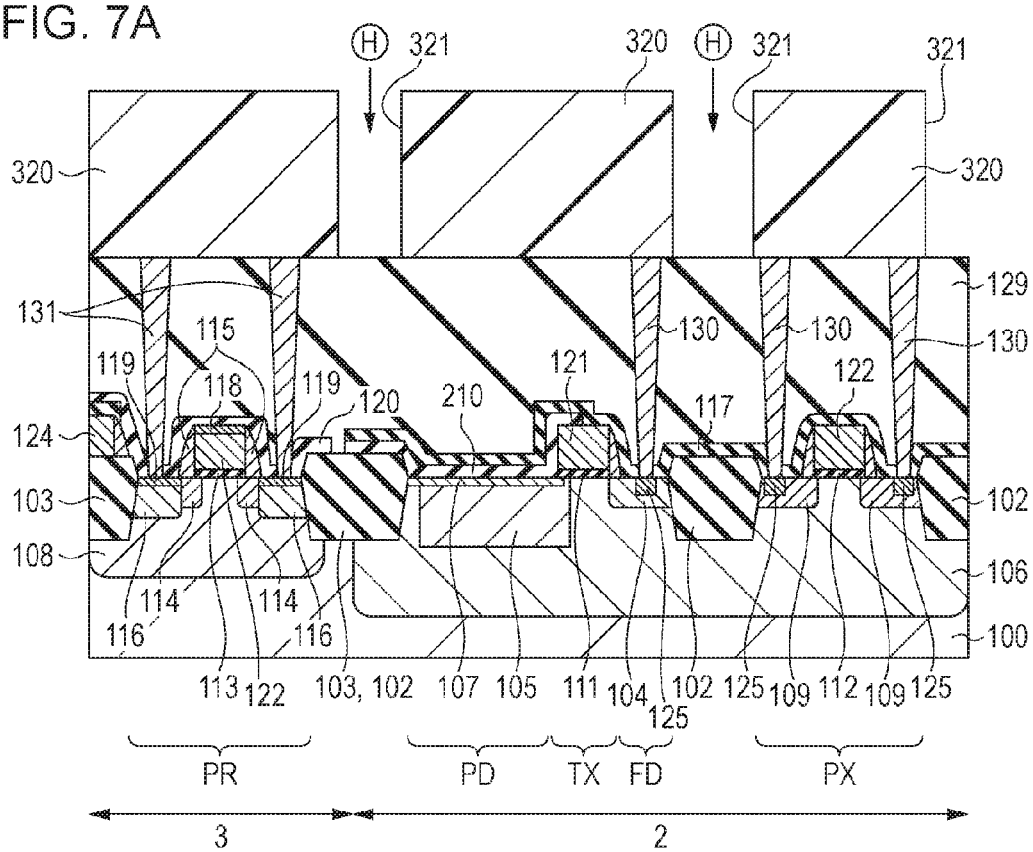
FIGS. 7A and 7B are schematic views illustrating a method for manufacturing an image pickup apparatus.
Figure 7B:
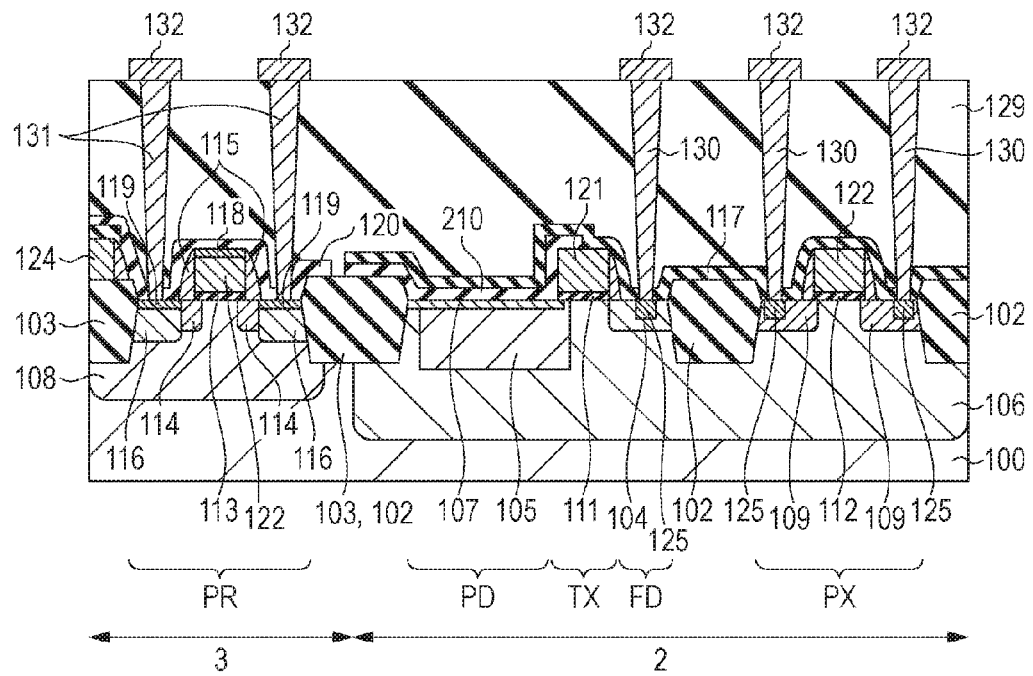

In a process d2 illustrated in FIG. 7A, an interlayer insulating film 129 and contact plugs 130 and 131 are formed over the semiconductor layer 100 in the same manner as the process e1. A mask member 320 is then formed on the interlayer insulating film 129. The mask member 320 is composed of a resin, such as a photoresist. The mask member 320 covers the element isolation portion 103 in the peripheral circuit region 3. The mask member 320 has an opening 321 on at least part of the element isolation portion 102 in the pixel circuit region 2. Thus, the mask member 320 does not overlap at least part of the element isolation portion 102 in the pixel circuit region 2. Although the mask member 320 covers the element portion in the pixel circuit region 2, the mask member 320 does not have to cover the element portion in the pixel circuit region 2. The mask member 320 may be disposed only on the element isolation portion 103 in the peripheral circuit region 3. Accelerated hydrogen ions are implanted into the element isolation portion 102 in the pixel circuit region 2 using the mask member 320 as a mask. The ion implantation is performed through the mask member 320 such that the concentration of hydrogen in the insulator of the element isolation portion 102 in the pixel circuit region 2 is higher than the concentration of hydrogen in the insulator of the element isolation portion 103 in the peripheral circuit region 3. Although part of accelerated hydrogen ions may also be implanted into the element isolation portion 103 through the mask member 320, the number of implanted hydrogen ions is much smaller in the element isolation portion 103 than in the element isolation portion 102 not covered with the mask member 320.

The energy for the hydrogen ion implantation is not particularly limited as long as the hydrogen concentration peak (Rp) is located within the insulator of the element isolation portion 102 in the pixel circuit region 2. The hydrogen ion implantation dosage can be determined such that the hydrogen concentration of the element isolation portion 102 is 10 times or more the hydrogen concentration of the element isolation portion 103 even after the subsequent processes. The hydrogen dosage is $5\times10^{15}$ (atoms/cm$^2$) or more, for example.

The ion implantation method allows hydrogen to be implanted into the element isolation portion 102 even when the element isolation portion 102 in the pixel circuit region 2 is covered with the silicon nitride layer 110. Furthermore, even when the photoelectric conversion unit PD or the amplifying transistor SF is covered with the silicon nitride layer 110, hydrogen can be implanted into the element isolation portion 102, and therefore the element isolation portion 102 can supply sufficient hydrogen to the photoelectric conversion unit PD and the amplifying transistor SF. After hydrogen ions are implanted, the mask member 320 is removed.

In the present embodiment, the silicon nitride layer 210 has an opening on the pixel transistor PX and on the element isolation portion 102 in the pixel circuit region 2. Thus, the silicon nitride layer 210 does not overlap at least part of the element isolation portion 102 in the pixel circuit region 2. A high process temperature in the manufacturing process after the hydrogen ion implantation therefore causes significant diffusion of hydrogen from the insulator of the element isolation portion 102 into the outside. Thus, the heat treatment temperature can be lowered after the process d2 of hydrogen ion implantation. In the present embodiment, the process d2 is preceded by a process involving heat treatment at a temperature of more than 600° C. for the purpose of activation of an impurity region, a reaction between a metal and the semiconductor layer 100, or reflowing of an insulator. The processes after the hydrogen ion implantation are performed such that the temperature of the semiconductor layer 100 is 600° C. or less. For example, heat treatment for supplying hydrogen from the passivation film to the device region can be performed at a temperature of 600° C. or less. The film-forming temperature of conductive lines and insulating films can also be 600° C. or less. The processes after the hydrogen ion implantation can be performed such that the temperature of the semiconductor layer 100 is 450° C. or less. In the present embodiment, the element isolation portion 102 can supply hydrogen to the semiconductor layer 100. Thus, even when heat treatment in a process of supplying hydrogen from the passivation film after the hydrogen ion implantation is performed at a temperature of 450° C. or less, noise in the pixel circuit region 2 can be sufficiently reduced.

In a third embodiment, after the process e1 in the first embodiment, if necessary, the semiconductor layer 100 can be made thinner after the passivation film 139 is formed. The semiconductor layer 100 is attached to a supporting substrate. A color filter or microlens may be disposed on a surface of the semiconductor layer 100 opposite the transistors and conductive lines. Thus, a backside illuminated image pickup apparatus can be provided.

A method for manufacturing an image pickup apparatus according to the present embodiment is a method for manufacturing an image pickup apparatus including a semiconductor layer that constitutes a pixel circuit region and a peripheral circuit region, comprising:
preparing a semiconductor layer in the pixel circuit region and the peripheral circuit region, the semiconductor layer including an element portion defined by an element isolation portion containing an insulator;
forming a member on the semiconductor layer, the member overlapping the element isolation portion in the peripheral circuit region and not overlapping at least part of the element isolation portion in the pixel circuit region; and
implanting accelerated hydrogen ions into the element isolation portion in the pixel circuit region using the member as a mask.

In the manufacturing method, the member may be removed after the implanting.

In the manufacturing method, a silicon nitride layer may be disposed on the element isolation portion in the pixel circuit region and on a photoelectric conversion unit in the pixel circuit region in the implanting.

In the manufacturing method, the silicon nitride layer may be disposed on an amplifying transistor in the pixel circuit region in the implanting.

The manufacturing method may include forming a silicide region in a transistor in a peripheral circuit region before the implanting and forming a passivation film covering the pixel circuit region after the implanting.

The manufacturing method may include forming a contact plug before the implanting, the contact plug being coupled to the semiconductor layer, and forming a conductive line after the implanting.

The manufacturing method may include before the implanting a process in which the temperature of the semiconductor layer is more than 600° C. and after the implanting no process in which the temperature of the semiconductor layer is more than 600° C.

In the manufacturing method, a silicon nitride layer may be disposed on a photoelectric conversion unit in the pixel circuit region in the implanting, and the silicon nitride layer does not overlap at least part of the element isolation portion in the pixel circuit region.

The manufacturing method may include after the implanting no process in which the temperature of the semiconductor layer is more than 450° C.

The present technique can simultaneously improve the characteristics of both the pixel circuit region and the peripheral circuit region.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-101335 filed May 18, 2015, which is hereby incorporated by reference herein in its entirety.

What is claimed is:

1. An image pickup apparatus comprising a semiconductor layer that constitutes a pixel circuit region and a peripheral circuit region, wherein
an element isolation portion is disposed in the pixel circuit region and the peripheral circuit region, defines an element portion of the semiconductor layer, and contains an insulator, and
the element isolation portion in the pixel circuit region has a hydrogen concentration 10 times or more higher than a hydrogen concentration of the element isolation portion in the peripheral circuit region.

2. An image pickup apparatus comprising a semiconductor layer that constitutes a pixel circuit region and a peripheral circuit region, wherein
an element isolation portion is disposed in the pixel circuit region and the peripheral circuit region, defines an element portion of the semiconductor layer, and contains an insulator,
a gate-insulating film of a MIS transistor in the peripheral circuit region has a thickness of 35 angstroms or less on a silicon oxide basis, and the element isolation portion in the pixel circuit region has a higher hydrogen concentration than the element isolation portion in the peripheral circuit region.

3. An image pickup apparatus comprising a semiconductor layer that constitutes a pixel circuit region and a peripheral circuit region, wherein
an element isolation portion is disposed in the pixel circuit region and the peripheral circuit region, defines an element portion of the semiconductor layer, and contains an insulator,
a passivation film containing hydrogen, a first conductive line between the passivation film and the semiconductor layer, and a second conductive line between the first conductive line and the passivation film are disposed on the semiconductor layer in the pixel circuit region,
the first conductive line and the second conductive line include a conductive portion containing aluminum and a barrier metal portion containing at least one of titanium nitride and titanium, and
the element isolation portion in the pixel circuit region has a higher hydrogen concentration than the element isolation portion in the peripheral circuit region.

4. The image pickup apparatus according to claim 2, wherein the element isolation portion in the pixel circuit region has a hydrogen concentration 10 times or more higher than a hydrogen concentration of the element isolation portion in the peripheral circuit region.

5. The image pickup apparatus according to claim 1, wherein an area occupancy OA of the element isolation portion in the pixel circuit region, an area occupancy OB of the element isolation portion in the peripheral circuit region, a hydrogen concentration CA of the element isolation portion in the pixel circuit region, and a hydrogen concentration CB of the element isolation portion in the peripheral circuit region satisfy OA<OB and CA×OA>CB×OB.

6. The image pickup apparatus according to claim 1, wherein an interlayer insulating film is disposed on the semiconductor layer in the pixel circuit region, and a silicon nitride layer is disposed between the interlayer insulating film and the element isolation portion in the pixel circuit region.

7. The image pickup apparatus according to claim 6, wherein the silicon nitride layer covers a photoelectric conversion unit and an amplifying transistor in the pixel circuit region.

8. The image pickup apparatus according to claim 7, wherein a contact plug coupled to the semiconductor layer is disposed in the pixel circuit region and penetrates the interlayer insulating film and the silicon nitride layer.

9. The image pickup apparatus according to claim 1, wherein a light shielded pixel is disposed in the pixel circuit region and includes a photoelectric conversion unit shaded with a light-shielding member, and the light-shielding member is covered with a passivation film containing hydrogen.

10. The image pickup apparatus according to claim 1, wherein a MIS transistor in the peripheral circuit region includes a cobalt silicide region or a nickel silicide region, and a MIS transistor in the pixel circuit region includes no cobalt silicide region and no nickel silicide region.

11. The image pickup apparatus according to claim 1, wherein a gate-insulating film of a MIS transistor in the pixel circuit region is thicker than a gate-insulating film of a MIS transistor in the peripheral circuit region.

12. An image pickup system comprising:
the image pickup apparatus according to claim 1; and
at least one of a control unit configured to control the image pickup apparatus, a processing unit configured to process signals sent from the image pickup apparatus, a display unit configured to display images sent from the image pickup apparatus, and a memory unit configured to store images sent from the image pickup apparatus.

13. An image pickup system comprising:
the image pickup apparatus according to claim 3; and
at least one of a control unit configured to control the image pickup apparatus, a processing unit configured to process signals sent from the image pickup apparatus, a display unit configured to display images sent from the image pickup apparatus, and a memory unit configured to store images sent from the image pickup apparatus.

14. The image pickup apparatus according to claim 3, wherein the element isolation portion in the pixel circuit region has a hydrogen concentration 10 times or more higher than a hydrogen concentration of the element isolation portion in the peripheral circuit region.

15. The image pickup apparatus according to claim 2, wherein an area occupancy OA of the element isolation portion in the pixel circuit region, an area occupancy OB of the element isolation portion in the peripheral circuit region, a hydrogen concentration CA of the element isolation portion in the pixel circuit region, and a hydrogen concentration CB of the element isolation portion in the peripheral circuit region satisfy OA<OB and CA×OA>CB×OB.

16. The image pickup apparatus according to claim 2, wherein an interlayer insulating film is disposed on the semiconductor layer in the pixel circuit region, and a silicon nitride layer is disposed between the interlayer insulating film and the element isolation portion in the pixel circuit region.

17. The image pickup apparatus according to claim 16, wherein the silicon nitride layer covers a photoelectric conversion unit and an amplifying transistor in the pixel circuit region.

18. The image pickup apparatus according to claim 17, wherein a contact plug coupled to the semiconductor layer is disposed in the pixel circuit region and penetrates the interlayer insulating film and the silicon nitride layer.

19. The image pickup apparatus according to claim 2, wherein a light shielded pixel is disposed in the pixel circuit region and includes a photoelectric conversion unit shaded with a light-shielding member, and the light-shielding member is covered with a passivation film containing hydrogen.

20. An image pickup system comprising:
the image pickup apparatus according to claim 2; and
at least one of a control unit configured to control the image pickup apparatus, a processing unit configured to process signals sent from the image pickup apparatus, a display unit configured to display images sent from the image pickup apparatus, and a memory unit configured to store images sent from the image pickup apparatus.

* * * * *